(12) United States Patent
Sun et al.

(10) Patent No.: US 10,594,308 B1
(45) Date of Patent: Mar. 17, 2020

(54) DIGITALLY ASSISTED CONTROL OVER COMPARATOR INPUT COMMON MODE

(71) Applicant: QUALCOMM Incorporated, San Diego, CA (US)

(72) Inventors: Lei Sun, San Diego, CA (US); Ganesh Kiran, San Diego, CA (US); Seyed Arash Mirhaj, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/236,721

(22) Filed: Dec. 31, 2018

(51) Int. Cl.
*H03M 1/10* (2006.01)
*H03K 5/24* (2006.01)
*H03M 1/46* (2006.01)

(52) U.S. Cl.
CPC .......... *H03K 5/2481* (2013.01); *H03M 1/46* (2013.01)

(58) Field of Classification Search
CPC ........ H03M 1/468; H03M 1/804; H03M 1/46; H03M 1/12; H03M 1/0607; H03M 1/1038; H03M 1/68; H03M 1/466; H03M 1/06; H03M 1/0682; H03M 1/1245; H03M 1/36; H03M 1/10
USPC ................... 341/118–120, 136, 155
See application file for complete search history.

(56) References Cited

U.S. PATENT DOCUMENTS

| | | | | |
|---|---|---|---|---|
| 5,512,848 A | * | 4/1996 | Yaklin ................. | H03K 5/2481 327/307 |
| 9,571,115 B1 | * | 2/2017 | Beukema ............ | H03M 1/1023 |
| 2010/0237907 A1 | * | 9/2010 | Santoro ............... | H03K 5/2481 327/77 |
| 2011/0309961 A1 | * | 12/2011 | Danjo ................. | H03M 1/1038 341/120 |
| 2012/0032722 A1 | * | 2/2012 | Mulder ............... | H03F 3/45192 327/307 |
| 2012/0274489 A1 | * | 11/2012 | Chang .................. | H03M 1/462 341/110 |
| 2014/0247170 A1 | * | 9/2014 | Nagarajan ............ | G06F 1/3296 341/155 |
| 2015/0244393 A1 | * | 8/2015 | Kabir ................... | H03M 3/488 341/143 |
| 2017/0214411 A1 | * | 7/2017 | Liu ...................... | H03M 1/1009 |
| 2018/0069566 A1 | * | 3/2018 | Soundararajan ........ | H03M 1/46 |
| 2018/0309948 A1 | * | 10/2018 | Harada ................. | H04N 5/378 |

* cited by examiner

*Primary Examiner* — Linh V Nguyen
(74) *Attorney, Agent, or Firm* — Patterson & Sheridan, L.L.P.

(57) ABSTRACT

Methods and apparatus for digitally controlling a common-mode voltage of a comparator. An example comparator circuit generally includes a first comparator and a sensing circuit configured to digitally track a common-mode voltage of the first comparator. The comparator circuit may further include a first capacitive array having a common terminal coupled to a first input of the first comparator and selectively coupled to an input of the sensing circuit. The comparator circuit may further include a second capacitive array having a common terminal coupled to a second input of the first comparator and selectively coupled to the input of the sensing circuit.

19 Claims, 9 Drawing Sheets

(12) United States Patent

US 10,594,308 B1

DIGITALLY ASSISTED CONTROL OVER COMPARATOR INPUT COMMON MODE

FIELD OF THE DISCLOSURE

Certain aspects of the present disclosure generally relate to electronic circuits and, more particularly, to a comparator circuit having digital common-mode voltage sensing.

DESCRIPTION OF RELATED ART

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of user equipment. A user equipment (UE) may communicate with a base station (BS) via a downlink and an uplink. The UE and/or BS may include a radio frequency front-end (RFFE) for transmitting and/or receiving radio frequency (RF) signals, and the receive path of the RFFE may include any of various suitable types of analog-to-digital converters (ADCs).

Several types of ADCs are available, each with varying advantages and disadvantages. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved comparator.

Certain aspects of the present disclosure provide an analog-to-digital converter (ADC). The ADC generally includes a first comparator having a first input and a second input; a second comparator having a first input, a second input, and an output; a digital-to-analog converter (DAC) coupled to at least one of the first input or the second input of the first comparator and selectively coupled to the first input of the second comparator; a common-mode voltage generator having an output coupled to the second input of the second comparator, wherein the common-mode voltage generator comprises a replica transistor matching an input-stage transistor of the first comparator; and a processing system having an input coupled to the output of the second comparator and having a set of outputs coupled to the DAC.

Certain aspects of the present disclosure provide a comparator circuit. The comparator circuit generally includes a first comparator and a sensing circuit configured to digitally track a common-mode voltage of the first comparator.

Certain aspects of the present disclosure provide a method for tracking a common-mode voltage of a first comparator. The method generally includes sampling the common-mode voltage of the first comparator, based on a common-mode input voltage and a reference voltage, across input terminals of the first comparator; comparing, using a second comparator, the sampled common-mode voltage to a target common-mode voltage; and adjusting control signals applied to a digital-to-analog converter (DAC) coupled to one of the input terminals of the first comparator according to the comparison between the sampled common-mode voltage and the target common-mode voltage.

Certain aspects of the present disclosure provide an apparatus for tracking a common-mode voltage of a comparator. The apparatus generally includes means for sampling a common-mode voltage, based on a common-mode input voltage and a reference voltage, across input terminals of the comparator; means for comparing the sampled common-mode voltage to a target common-mode voltage; and means for adjusting digital control signals applied to a digital-to-analog converter (DAC) coupled to one of the input terminals of the comparator according to the comparison between the sampled common-mode voltage and the target common-mode voltage.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide apparatus and methods for digitally tracking a common-mode voltage of a comparator.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (SGTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communication System

Figure 1:
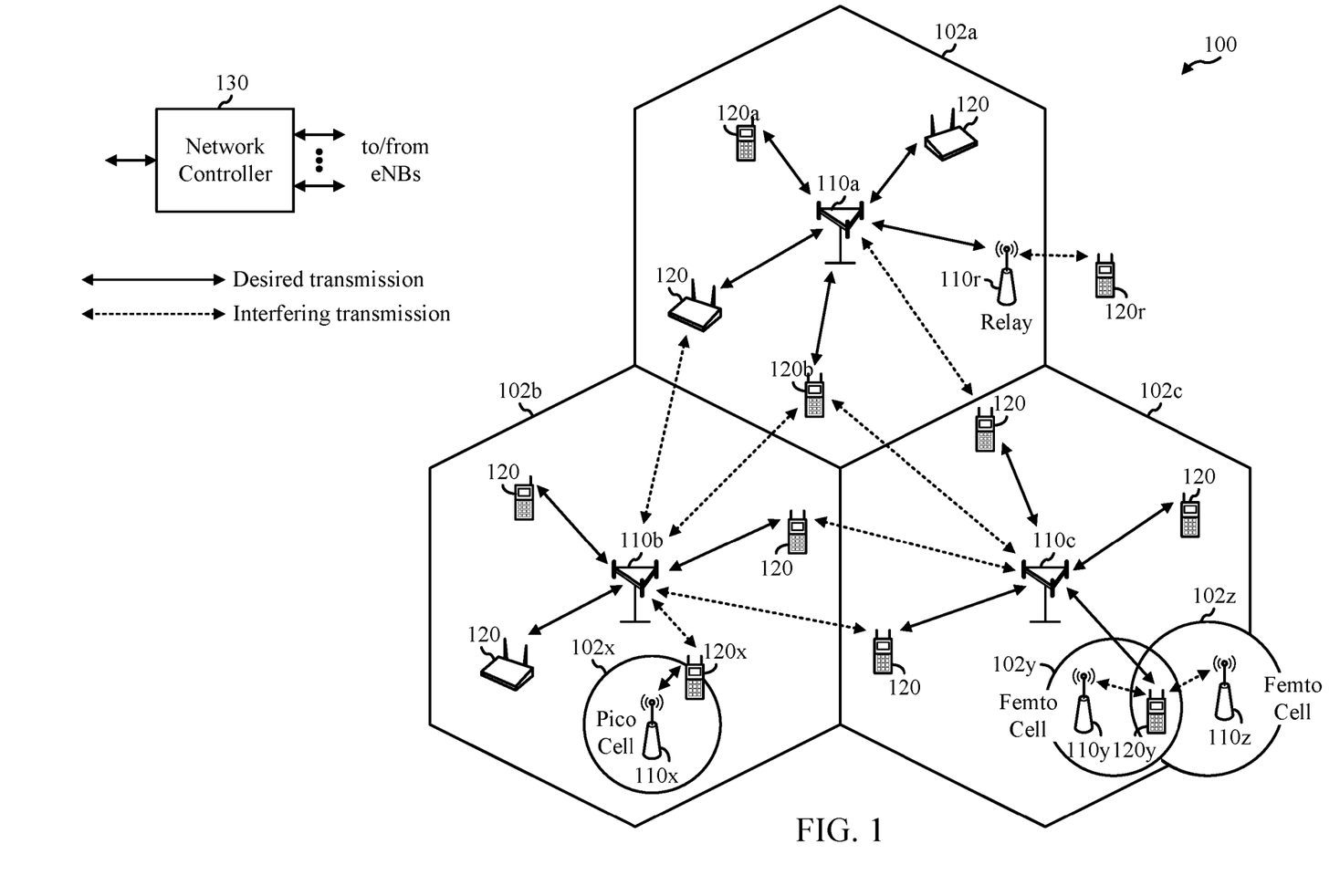
FIG. 1 is a block diagram conceptually illustrating an example telecommunications system, in accordance with certain aspects of the present disclosure.

FIG. 1 illustrates an example wireless communication network 100 in which aspects of the present disclosure may be performed. For example, the wireless communication network 100 may be a New Radio (NR) or 5G network. Wireless devices in the wireless network 100 may be equipped with a comparator circuit described herein to digitally track and adjust a common-mode voltage as further described herein.

As illustrated in FIG. 1, the wireless network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation Node B (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110$a$, 110$b$ and 110$c$ may be macro BSs for the macro cells 102$a$, 102$b$ and 102$c$, respectively. The BS 110$x$ may be a pico BS for a pico cell 102$x$. The BSs 110$y$ and 110$z$ may be femto BSs for the femto cells 102$y$ and 102$z$, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110$r$ may communicate with the BS 110$a$ and a UE 120$r$ in order to facilitate communication between the BS 110$a$ and the UE 120$r$. A relay station may also be referred to as a relay BS, a relay, etc.

Wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, a macro BS may have a high transmit power level (e.g., 20 watts (W)) whereas a pico BS, a femto BS, and relays may have a lower transmit power level (e.g., 1 W).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120$x$, 120$y$, etc.) may be dispersed throughout the wireless network 100, and each UE may be stationary or mobile. A UE may also be referred to as a mobile station (MS), a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a Global Positioning System (GPS) device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz, and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for a system bandwidth of 1.25, 2.5, 5, 10, or 20 megahertz (MHz), respectively. The system bandwidth may also be partitioned into subbands. For example, a subband may cover 1.8 MHz (i.e., 6 resource blocks), and there may be 1, 2, 4, 8, or 16 subbands for a system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a cyclic prefix (CP) on the uplink and downlink and include support for half-duplex operation using time-division duplexing (TDD). Beamforming may be supported, and beam direction may be dynamically configured. Multiple-input, multiple-output (MIMO) transmissions with precoding may also be supported. MIMO configurations in the downlink (DL) may support up to 8 transmit antennas with multi-layer DL transmissions up to 8 streams and up to 2 streams per UE. Aggregation of multiple cells may be supported with up to 8 serving cells.

In some examples, access to the air interface may be scheduled, wherein a scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
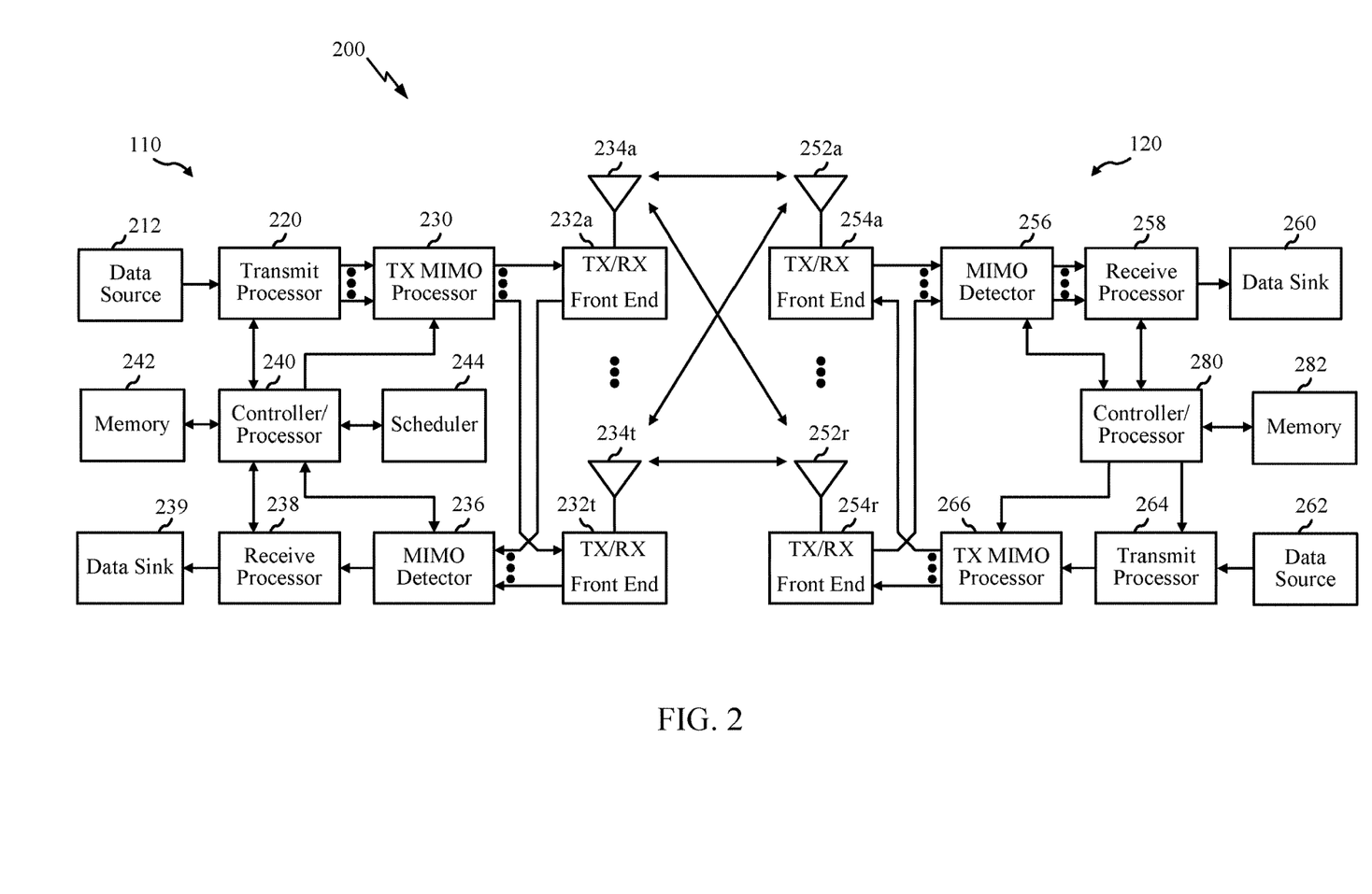
FIG. 2 is a block diagram conceptually illustrating a design of an example base station (BS) and an example user equipment (UE), in accordance with certain aspects of the present disclosure.

FIG. 2 illustrates example components of BS 110 and UE 120 (as depicted in FIG. 1), which may be used to implement aspects of the present disclosure. For example, a transceiver front end 254 of the UE 120 and/or a transceiver front end 232 of the BS 110 may perform the various techniques and methods described herein (e.g., operations 700 of FIG. 7 and/or operations 900 of FIG. 9).

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the transmit (TX) front-end circuits 232a through 232t. Each TX front-end circuit 232 may process a respective output symbol stream (e.g., for OFDM, etc.) to obtain an output sample stream. Each TX front-end circuit may further process (e.g., convert to analog, amplify, filter, and upconvert) the output sample stream to obtain a downlink signal. Downlink signals from TX front-end circuits 232a through 232t may be transmitted via the antennas 234a through 234t, respectively.

At the UE 120, the antennas 252a through 252r may receive the downlink signals from the BS 110 and may provide received signals to the receive (RX) front-end circuits 254a through 254r, respectively. Each RX front-end circuit 254 may condition (e.g., filter, amplify, downconvert, and digitize) a respective received signal to obtain input samples. Each RX front-end circuit may further process the input samples (e.g., for OFDM, etc.) to obtain received symbols. A MIMO detector 256 may obtain received symbols from all the RX front-end circuits 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the RX front-end circuits 254a through 254r (e.g., for SC-FDM, etc.), and transmitted to the BS 110. At the BS 110, the uplink signals from the UE 120 may be received by the antennas 234, processed by the TX front-end circuits 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

The controllers/processors 240 and 280 may direct the operation at the BS 110 and the UE 120, respectively. The processor 240 and/or other processors and modules at the BS 110 may perform or direct the execution of processes for the techniques described herein. The memories 242 and 282 may store data and program codes for BS 110 and UE 120, respectively. A scheduler 244 may schedule UEs for data transmission on the downlink and/or uplink. In certain aspects, the TX/RX front-end circuits 232, 254 may include a tuning circuit for adjusting a source impedance seen by a portion of a receive path, as further described herein.

Figure 3:
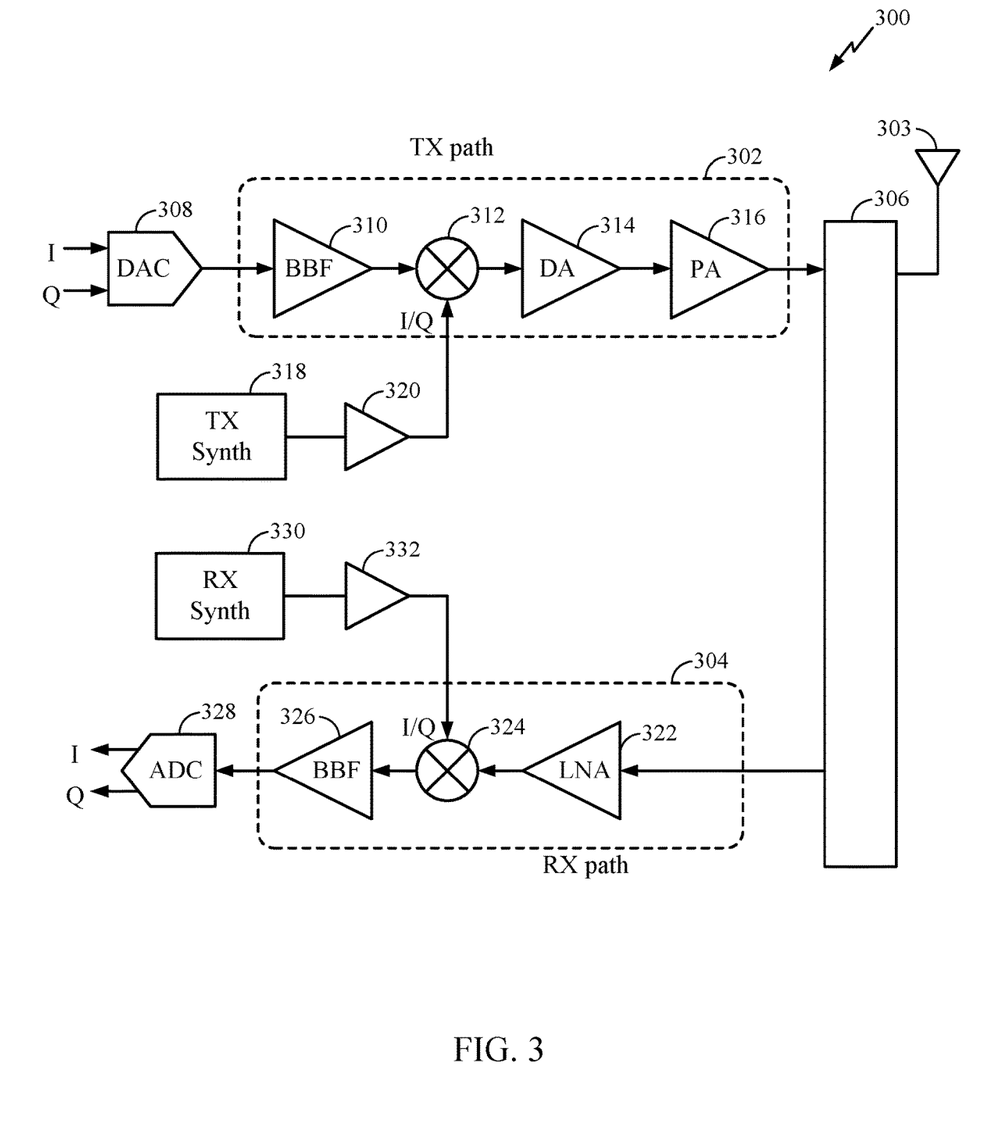
FIG. 3 is a block diagram showing an example transceiver front-end, in accordance with certain aspects of the present disclosure.

FIG. 3 is a block diagram of an example transceiver front-end 300, such as TX/RX front-end circuits 232, 254 in FIG. 2, in which aspects of the present disclosure may be practiced. The transceiver front-end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for analog-to-digital conversion or digitally tracking a common-mode voltage of a comparator in any of various other suitable systems.

Example ADC

Figure 4:
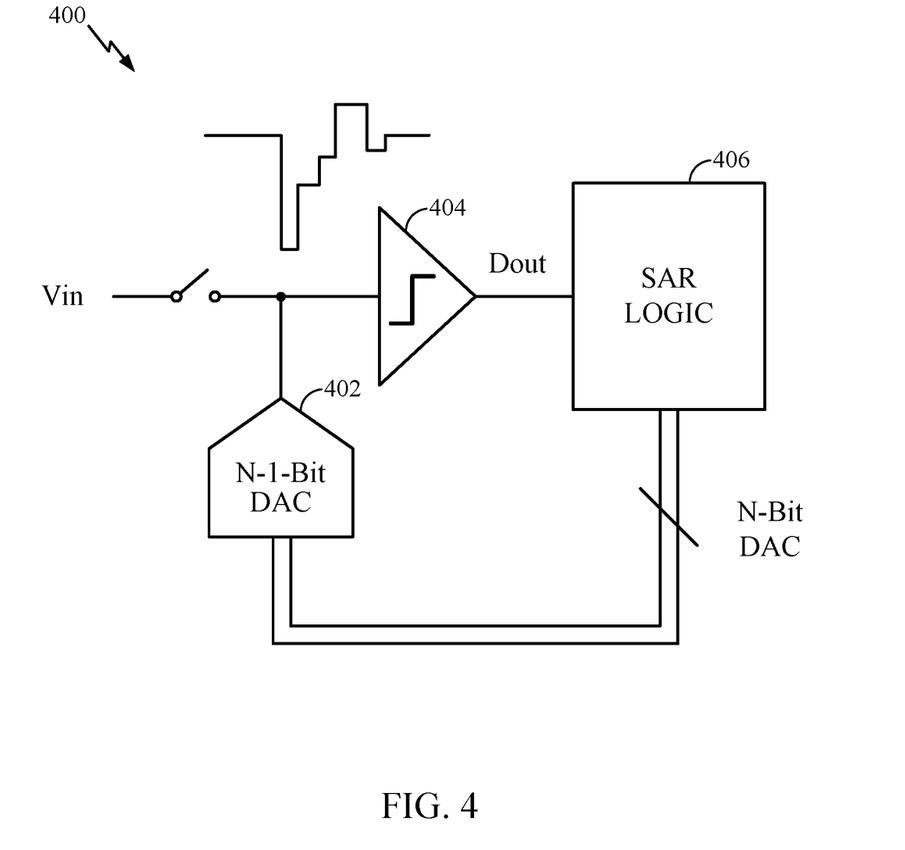
FIG. 4 is a block diagram of an example successive approximation register (SAR) analog-to-digital converter (ADC), in accordance with certain aspects of the present disclosure.

FIG. 4 conceptually illustrates an example successive approximation register (SAR) ADC 400, in accordance with certain aspects of the present disclosure. As shown, the SAR ADC 400 includes a DAC 402 (e.g., a capacitive array DAC (C-DAC)), a comparator 404, and a SAR logic unit 406. An analog input signal (Vin) is sampled by one or more switches coupled to the DAC 402 (e.g., when the sampling clock is high), and the analog-to-digital conversion is started when the sampling clock goes low and the input signal is disconnected. During the conversion phase, a binary search may be performed by the comparator 404 and the SAR logic unit 406 to find a digital output using the DAC 402. The SAR logic unit 406 has one or more inputs coupled to one or more outputs of the comparator 404, and one or more outputs coupled to control terminals of the DAC 402. As an example, to resolve n+1 bits, n DAC operations may be performed by the DAC 402. Thus, the digital output (Dout) is a digital representation of the analog input voltage including any quantization noise (Q).

Example Comparator

The performance of certain comparators (such as a StrongArm comparator) may be correlated to the input common-mode voltage. For example, a relatively high input common-mode voltage may facilitate higher speed comparisons, but greater noise. The comparator performance may also vary widely across process, supply voltage levels, and temperature. For example, a relatively slow transistor corner may provide lower noise with slower speeds, whereas a relatively fast transistor corner may provide higher noise with faster speeds.

With certain SAR ADC designs, the comparator input common-mode voltage may be generated by a switched-capacitor network (e.g., a C-DAC). The common-mode voltage may depend on the input common-mode voltage of the input signal, the reference voltage applied to the switched-capacitor network, and an internal common-mode voltage. As an example, the comparator input common-mode voltage for bottom-plate capacitor sampling may be given by:

$$Vcm\_comp = Vcm\_int + (Vref/2 - Vcm\_in) \quad (1)$$

where Vcm_comp is the comparator input common-mode voltage, Vcm_int is the internal common-mode voltage source, Vref is the reference voltage, and Vcm_in is the input common-mode voltage of the input signal for the ADC.

The comparator input common-mode voltage for top-plate capacitor sampling may be given by:

$$Vcm\_comp = Vcm\_in + (Vref/2 - Vcm\_dac) \quad (2)$$

where Vcm_dac is the reference generated common-mode voltage from the C-DAC.

As further described herein for certain aspects of the present disclosure, tracking and adjusting the comparator common-mode voltage may provide a mechanism for controlling the performance of a comparator in a way such that the speed and/or noise are set independent of variations in process, supply voltages, temperature, input common mode, and/or the reference voltage. As an example, the comparator common mode may be tracked and adjusted using an auxiliary comparator, searching algorithms, and control signals applied to the C-DAC. The C-DAC enables accurate digital tracking of the common-mode voltage. For example, the error of the common-mode tracking described herein may depend on the least-significant bit (LSB) of the DAC and any voltage offset and/or noise from the auxiliary comparator. The auxiliary comparator as further described herein may be used to compare the target common-mode voltage (Vcm) and a sensed comparator common-mode voltage (Vcm_sens). The comparator circuit described herein provides advantages including tracking without an amplifier or decoupling capacitor.

Figure 5:
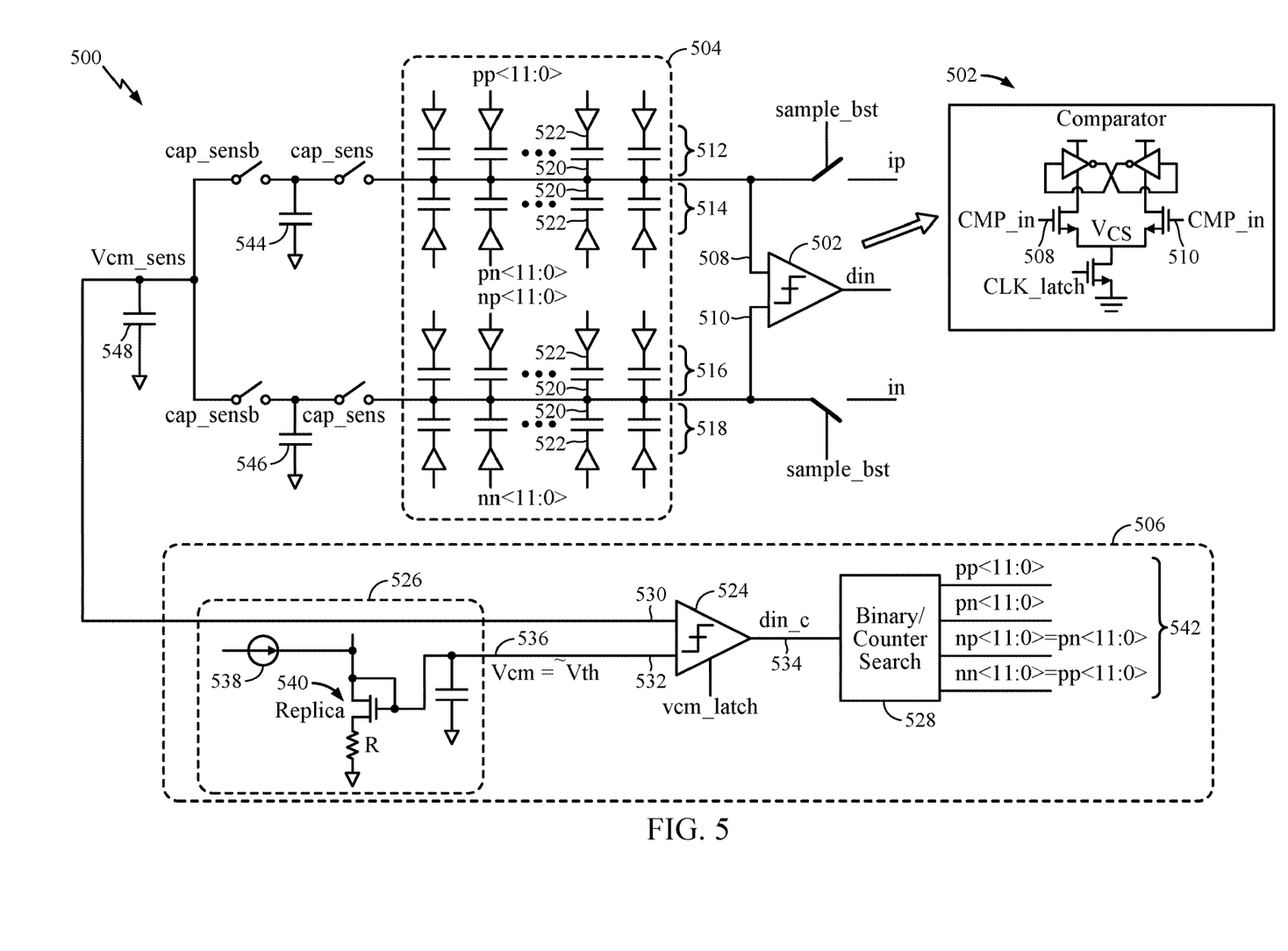
FIG. 5 is a diagram of an example comparator circuit, in accordance with certain aspects of the present disclosure.

FIG. 5 is a diagram of an example comparator circuit 500 that employs digital tracking and adjustment of the comparator common-mode, in accordance with certain aspects of the present disclosure. As shown, the comparator circuit 500 includes a first comparator 502, a DAC 504, and a sensing circuit 506. The first comparator 502 may be a latched comparator having a first input 508 and a second input 510.

The first comparator 502 and DAC 504 may be used in a SAR ADC, such as the SAR ADC 400 depicted in FIG. 4. In certain aspects, the C-DAC of a SAR-ADC may be used to control the comparator common-mode voltage during the sampling phase such that the sensed common-mode voltage (Vcm_sens) is adjusted to match a target common-mode voltage (Vcm).

In certain aspects, the DAC 504 may be an N-bit capacitive DAC having one or more capacitive arrays 512, 514, 516, and 518. For other aspects, the DAC 504 may be a resistive or other type of DAC. As shown in FIG. 5, the DAC 504 includes a first capacitive array 512, a second capacitive array 514, a third capacitive array 516, and a fourth capacitive array 518. Each of the capacitive arrays 512, 514, 516, and 518 may have first terminals 520 coupled to at least one of the first input 508 or second input 510 of the first comparator 502 and selectively coupled to an input of the sensing circuit 506 as further described herein. Each of the capacitive arrays 512, 514, 516, and 518 may have second terminals 522 coupled to a set of outputs of the sensing circuit 506 as further described herein. Each of the capacitive arrays 512, 514, 516, and 518 may be a binary-weighted capacitive array. A binary-weighted capacitive array includes an array of capacitors arranged in parallel branches, each branch having a binary-weighted capacitance value and selected via a switch coupled to the branch.

The circuit common-mode voltage may be sampled for the sensing circuit 506 using one or more sensing capacitors 544, 546, and 548. A first sensing capacitor 544 may be selectively coupled to the first input 508 of the first comparator 502 (by control signal "cap_sens") and selectively coupled to the input of sensing circuit 506 (by control signal "cap_sensb," which is generally the inverse of cap_sens). A second sensing capacitor 546 may be selectively coupled to the second input 510 of the first comparator 502 (by cap_sens) and selectively coupled to the input of the sensing circuit 506 (by cap_sensb). A third sensing capacitor 548 may be coupled to the input of the sensing circuit 506.

In certain aspects, the sensing circuit 506 may digitally track a common-mode voltage of the first comparator 502. The sensing circuit 506 may include a second comparator 524 (also referred to as an "auxiliary comparator"), a common-mode voltage generator 526, and a processing system 528 (also referred to as a "digital engine"). As shown, the second comparator 506 has a first input 530, a second input 532, and an output 534. The DAC 504 may be selectively coupled to the first input 530 of the second comparator 524. The common-mode voltage generator 526 may be coupled to the second input 532 of the second comparator 524. The output 534 of the second comparator 524 may be coupled to an input of the processing system 528. For example, the output signal din_c may represent the comparison of whether the circuit common-mode voltage matches a target common-mode voltage. The second comparator 524 may be clocked at a relatively low speed compared to the first comparator 502.

The common-mode voltage generator 526 may output a target common-mode voltage that is supplied to the second input 532 of the second comparator 524. As such, the common-mode voltage generator 526 may have an output 536 coupled to the second input 532 of the second comparator 524. The common-mode voltage generator 526 may include a current source 538 and a replica transistor 540. The current source 538 may be coupled to the drain and gate of the replica transistor 540, and the source of the replica transistor 540 may be coupled to a reference voltage, such as ground, via a resistive element (e.g., resistor with resistance R as shown). The replica transistor 540 may match an input-stage transistor of the first comparator 502. For example, the replica transistor 540 may be the same type, have the same dimensions, and thus have the same threshold voltage as the input-stage transistor of the first comparator 502. The replica transistor 540 may enable the common-mode voltage generator 526 to track variations in the input-stage transistors of the first comparator 502.

The processing system 528 may adjust control signals applied to the DAC 504 based on the output of the second comparator 524. As shown, a set of digital control signal outputs 542 may be coupled to the second terminals 522 of the capacitive arrays 512, 514, 516, and 518. In certain aspects, the set of digital control signal outputs 542 may include control signals pp<N−1:0>, pn<N−1:0>, np<N−1:0>, and nn<N−1:0> coupled to the first or second terminals of the capacitive arrays 512. As shown, the control signals pp<N−1:0>, pn<N−1:0>, np<N−1:0>, and nn<N−1:0> may be twelve bits in length (N=12). For some aspects, the control signals nn<N−1:0> may have the same values as control signals pp<N−1:0>, and the control signals np<N−1:0> may have the same values as control signals pn<N−1:0>. The processing system 528 may adjust the control signals applied to the DAC according to a search process (e.g., a linear search process and/or a binary search process). In certain aspects, the processing system 528 may adjust (increase or decrease) a digital value of the control signals according to the search process. For example, during an error-checking phase as further described herein, the processing system 528 may adjust a digital value of the control signals by one least-significant bit (LSB) of the DAC 504 in one direction (e.g., only decreasing or only increasing).

In certain aspects, the processing system 528 may perform a binary search in the foreground and a linear search in the background. For example, a linear search may be used to account for certain slow variations in operating characteristics of the first comparator, such as variations in a temperature of the first comparator 502, a supply voltage applied to the first comparator 502, or a clocking speed (e.g., slow corner or fast corner) applied to the first comparator 502.

In certain aspects, the processing system 528 may perform the binary search using the full range of bits (e.g., N-bit) of the DAC 504. In other aspects, the processing system may perform a binary search using fewer bits of the DAC 504 (e.g., N−1, N−2, or less bits). Using the full range of bits will have the maximum dynamic range, but will have the largest step size.

In certain aspects, the processing system 528 may perform the linear search by adjusting the digital value of the control signal word by one or more LSBs during each iteration of the linear search. Using more than one LSB may reduce the time to perform the search, but also reduce the accuracy of the digital tracking.

Figure 6:
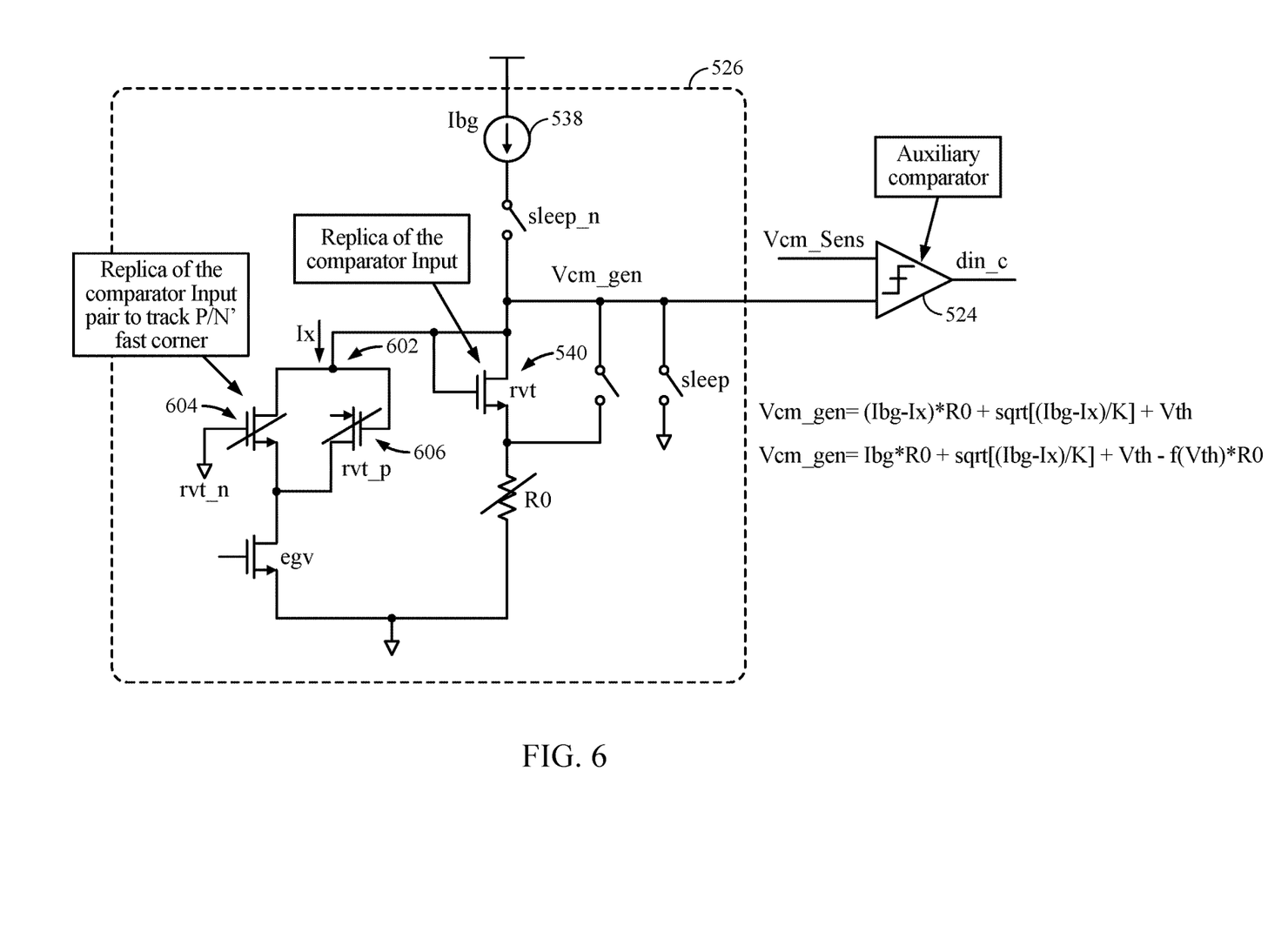
FIG. 6 is a diagram of an example common-mode voltage generator coupled to a second comparator of the comparator circuit depicted in FIG. 5, in accordance with certain aspects of the present disclosure.

FIG. 6 is a diagram of an example common-mode voltage generator 526 coupled to the second comparator 524, in accordance with certain aspects of the present disclosure. As shown, the common-mode voltage generator 526 may include a current source 538, a replica transistor 540, and a leakage path circuit 602. The leakage path circuit 602 may include at least one of an n-channel transistor 604 or a p-channel transistor 606 being the same type of device as the replica transistor 540 (e.g., low voltage threshold (LVT) or regular voltage threshold (RVT)). The leakage path circuit 602 may be enabled to introduce current leakage and reduce the target common-mode voltage during fast corners of the first comparator 502. Enabling the leakage path circuit 602 may reduce comparator noise during the fast corners without significantly degrading the speed of the comparator.

Figure 7:
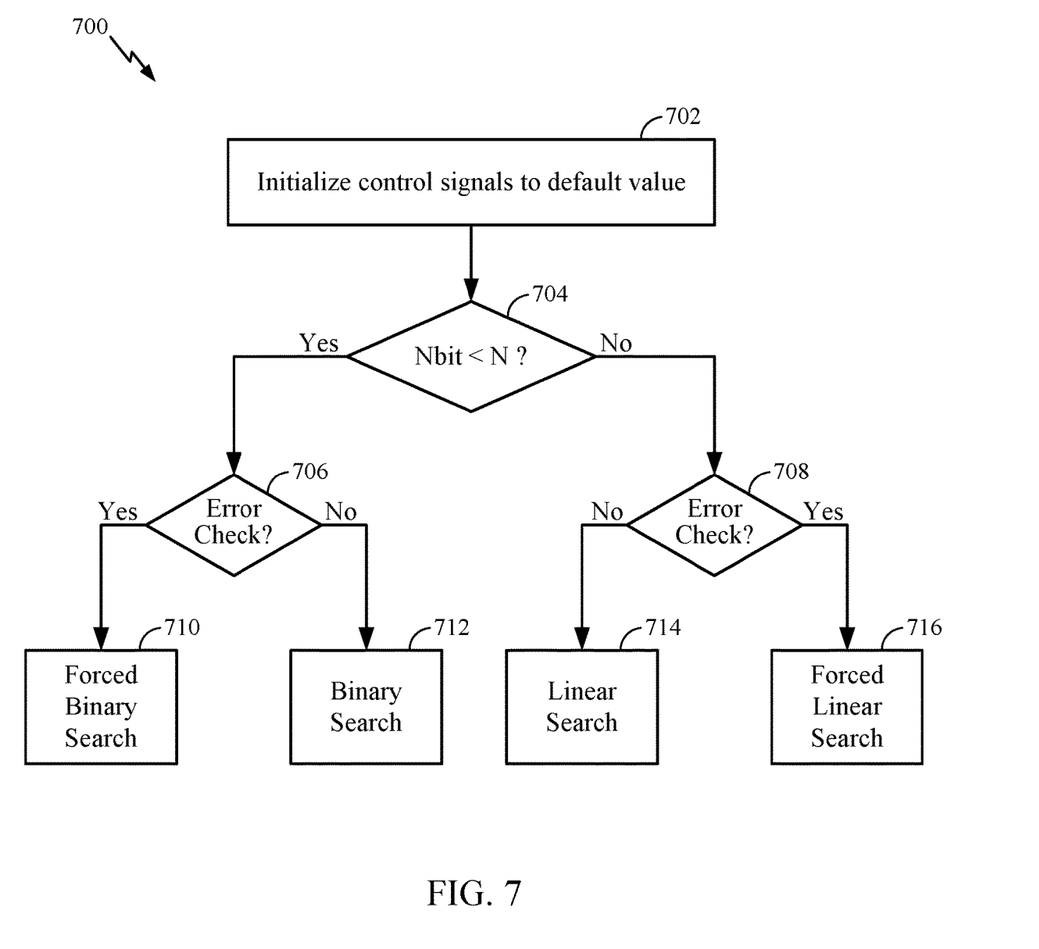
FIG. 7 is a flow diagram illustrating example operations for digitally tracking the comparator common-mode voltage, in accordance with certain aspects of the present disclosure.

FIG. 7 is a flow diagram illustrating example operations 700 for tracking the comparator common-mode voltage, in accordance with certain aspects of the present disclosure. The operations 700 may be performed, for example by a processing system (e.g., the processing system 528 depicted in FIG. 5).

The operations 700 may begin, at block 702, where the processing system initializes the DAC to a default value. For example, the processing system may apply a default digital value of the control signals to the second terminals of the capacitive arrays. In certain aspects, the DAC may be pre-charged to a default digital value relative to a reference voltage, such as a digital value corresponding to half of a reference voltage (Vref/2). For other aspects, the DAC may be pre-charged with an initial condition in a voltage range for the DAC, such as between 0 V and the reference voltage (Vref). The processing system may continue to apply the control signals of the default value until the capacitive arrays settle to the default voltage. The initialization process may be programmed to a certain number of clock cycles, such as 10, 100, 250, or 500 clock cycles.

At block 704, the processing system may determine whether to perform a binary search or linear search. As an example, the binary step value may determine whether to perform a binary search or a linear search. At block 706, if the binary step (Nbit) is less than the MSB (N), the processing system may determine whether error checking is enabled. At block 710, if error checking is enabled, the processing system may perform a forced binary search, such as by adjusting the digital value of the control signals applied to the capacitive arrays in one direction (e.g., only decreasing values or only increasing values). At block 712, if error checking is disabled, the processing system may perform a binary search. Under the binary search, the processing system may increase or decrease the digital value of the control signals with binary steps based on the output of the auxiliary comparator. For example, if the auxiliary comparator indicates that the common-mode voltage is below the target common-mode voltage, the digital value of the control signals may be increased with a binary step (e.g., pp<N−1:0>+2^(N−Nbit)), whereas if the auxiliary comparator indicates that the common-mode voltage is above the target common-mode voltage, the digital value of the control signals may be decreased with a binary step (e.g., pn<N−1:0>+2−(N−Nbit)).

At block 708, if the binary step (Nbit) is equal to the MSB (N), the processing system may determine whether error checking is enabled. At block 714, if error checking is disabled, the processing system may perform a linear search. Under the linear search, the processing system may increase or decrease the digital value of the control signals with linear steps based on the output of the auxiliary comparator. For example, if the auxiliary comparator indicates that the common-mode voltage is below the target common-mode voltage, the digital value of the control signals may be increased with a linear step (e.g., pp<N−1:0>+1), whereas if the auxiliary comparator indicates that the common-mode voltage is above the target common-mode voltage, the digital value of the control signals may be decreased with a linear step (e.g., pp<N−1:0>1). At block 716, if error checking is enabled, the processing system may perform a forced linear search, such as by adjusting the digital value of the control signals applied to the capacitive arrays in one direction (e.g., only decreasing values or only increasing values).

Figure 8A:
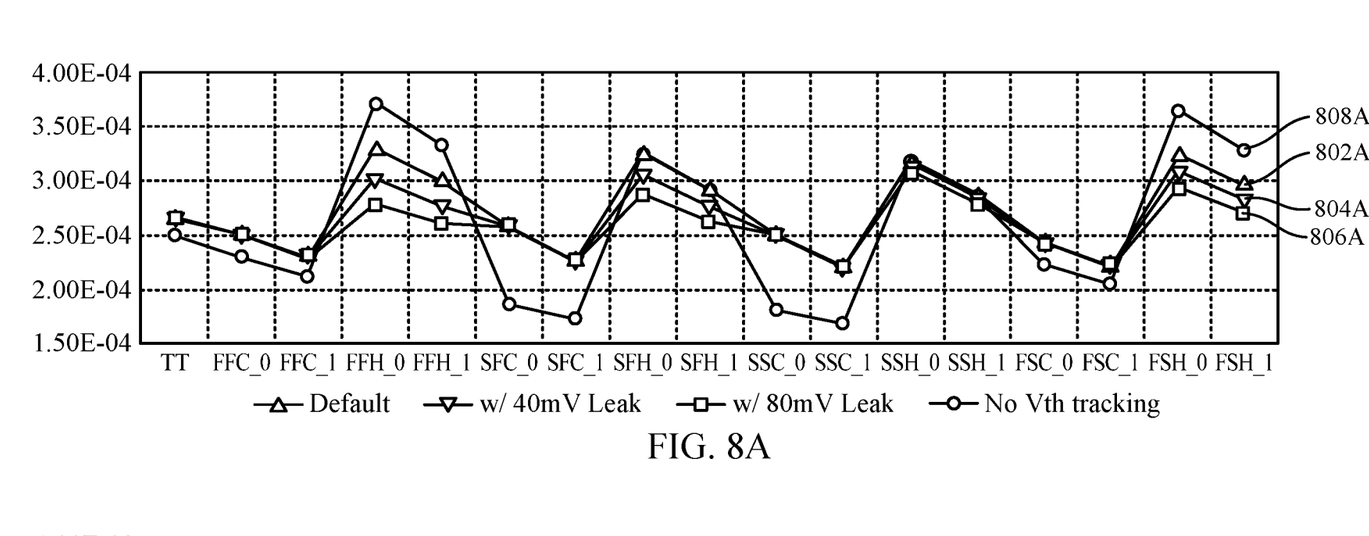
FIG. 8A is an example graph of comparator noise versus various process, voltage, and temperature corners, in accordance with certain aspects of the present disclosure.

FIG. 8A is an illustration of an example graph of comparator noise versus various process, voltage, and temperature corners, in accordance with certain aspects of the present disclosure. As shown, curves 802A, 804A, 806A, and 808A represent the comparator noise as a function of various corners including a typical-typical (TT) corner, fast-fast (FF) corners (FFC_0, FFC_1, FFH_0, FFH_1, where "C" refers to cold, "H" refers to hot, "0" refers to a low supply voltage, and "1" refers to a high supply voltage), slow-fast (SF) corners (SFC_0, SFC_1, SFH_0, SFH_1), slow-slow (SS) corners (SSC_0, SSC_1, SSH_0, SSH_1), and fast-slow (FS) corners (FSC_0, FSC_1, FSH_0, FSH_1). The curve 802A represents the comparator noise with common-mode tracking without a leakage path enabled. The curve 804A represents the comparator noise with common-mode tracking and 40 mV of leakage enabled. The curve 806A represents the comparator noise with common-mode tracking and 80 mV of leakage enabled. The curve 808A represents the comparator noise without common-mode tracking. FIG. 8A demonstrates that the comparator noise is reduced with common-mode tracking, and enabling leakage may further reduce the comparator noise, especially in fast corner applications (e.g., FF, SF, or FS).

Figure 8B:
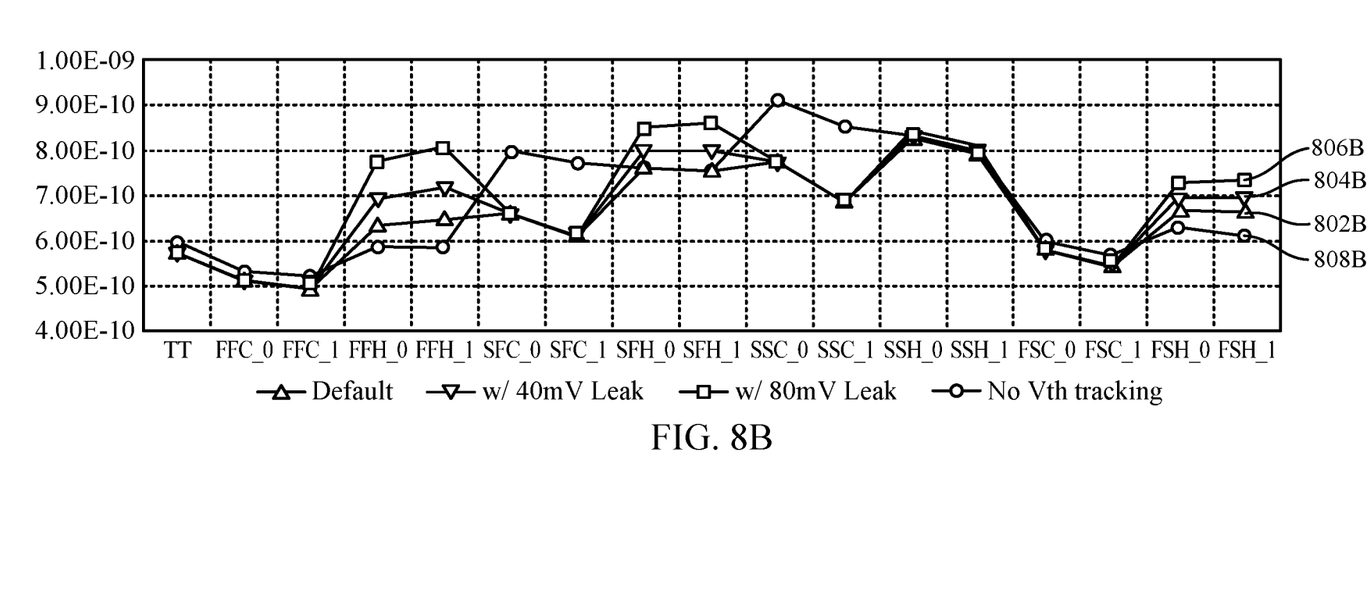
FIG. 8B is an illustration of an example graph of comparator speed versus various process, voltage, and temperature corners, in accordance with certain aspects of the present disclosure.

FIG. 8B is an illustration of an example graph of comparator time in seconds versus various process, voltage, and temperature corners, in accordance with certain aspects of the present disclosure. As shown, curves 802B, 804B, 806B, and 808B represent the comparator time as a function of various corners including a TT corner, FF corners (FFC_0, FFC_1, FFH_0, FFH_1), SF corners (SFC 0, SFC 1, SFH_0, SFH_1), SS corners (SSC_0, SSC_1, SSH_0, SSH_1), and FS corners (FSC_0, FSC_1, FSH_0, FSH_1). The curve 802B represents the comparator time with common-mode tracking and a leakage path disabled. The curve 804B represents the comparator time with common-mode tracking and 40 mV of leakage enabled. The curve 806B represents the comparator time with common-mode tracking and 80 mV of leakage enabled. The curve 808B represents the comparator time without common-mode tracking. FIG. 8B demonstrates that the comparator time may vary depending on the common-mode tracking employed (e.g., leakage or no leakage) and corner. For example, under SS process corners, the common-mode tracking with or without leakage enabled (curves 802B, 804B, and 806B) may provide a reduced comparator time compared to the case without common-mode tracking (curve 808B).

Figure 9:
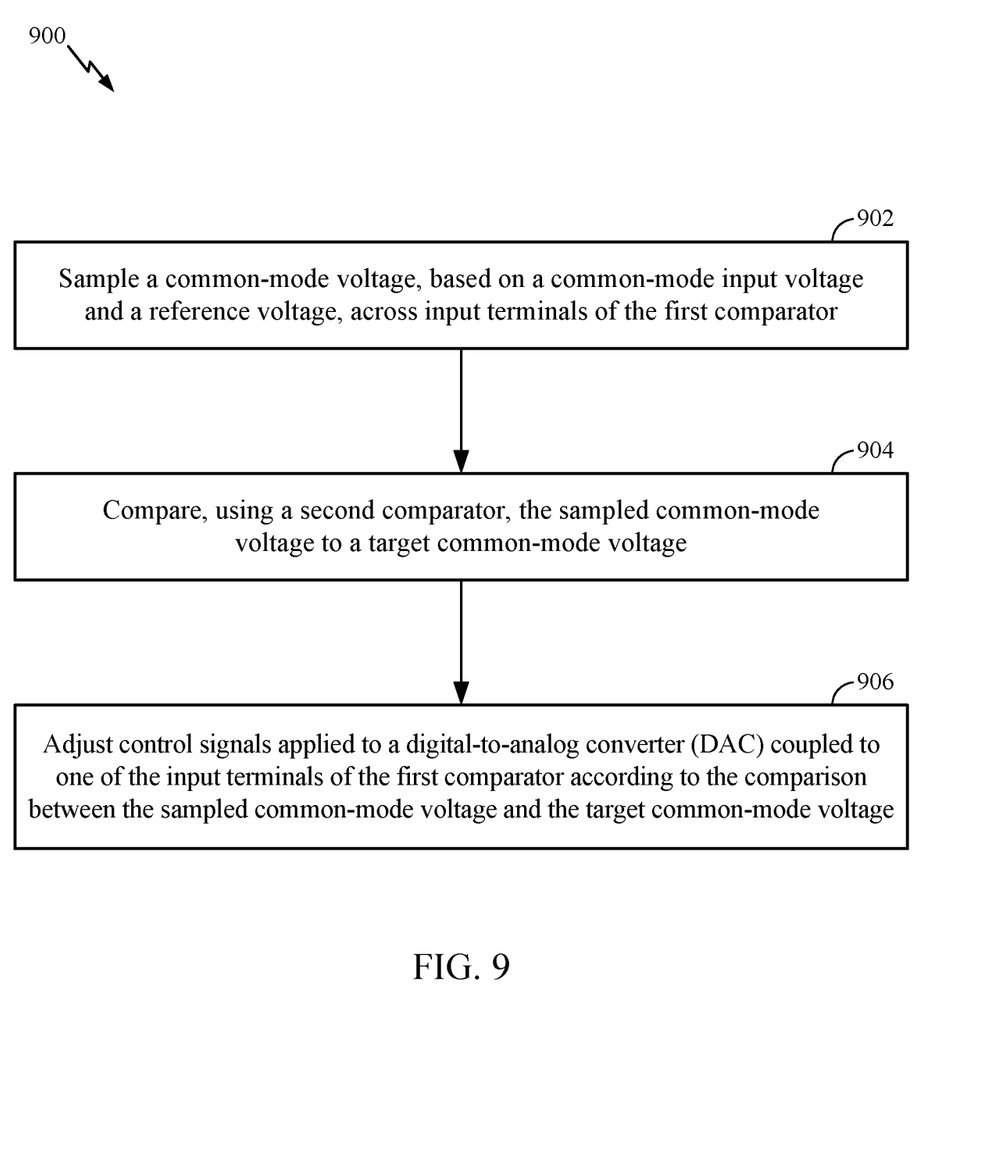
FIG. 9 is a flow diagram illustrating example operations for sensing and digitally adjusting a comparator common-mode voltage, in accordance with certain aspects of the present disclosure.

FIG. 9 is a flow diagram illustrating example operations 900 for digitally tracking a comparator common-mode voltage, in accordance with certain aspects of the present disclosure. The operations 900 may be performed, for example, by a comparator circuit (e.g., the comparator circuit 500 depicted in FIG. 5). The operations 900 may begin, at block 902, where the comparator circuit may sample a common-mode voltage, based on a common-mode input voltage and a reference voltage, across input terminals of a first comparator (e.g., comparator 502 of FIG. 5).

At block 904, the comparator circuit may compare, using a second comparator (e.g., comparator 524 of FIG. 5), the sampled common-mode voltage (e.g., Vcm_sens) to a target common-mode voltage (e.g., Vcm). In certain aspects, the target common-mode voltage may be generated to replicate a threshold voltage of an input-stage transistor in the first comparator. The target common-mode voltage may be generated with a leakage path during a fast corner. The leakage path may be coupled in parallel with a replica transistor matching an input-stage transistor of the first comparator. The leakage path may include a diode-connected p-channel or n-channel transistor.

At block 906, the comparator circuit may adjust control signals applied to a digital-to-analog converter (DAC) coupled to one of the input terminals of the first comparator according to the comparison between the sampled common-mode voltage and the target common-mode voltage. In certain aspects, adjusting the control signals may include adjusting the control signals using a search process (such as a binary search process and/or a linear search process). In certain aspects, using the search process may include adjusting (e.g., increasing or decreasing) a digital value of the control signals by one LSB during each iteration of the search process (e.g., one clock period for the clock signal applied to the first comparator). For other aspects, using the search process may entail adjusting (e.g., increasing or decreasing) a digital value of the control signals by two LSBs, three LSBs, or more during an iteration of the search process.

It should be appreciated that the digitally assisted common-mode tracking described herein enables a SAR ADC to reduce the effects of variations in process corner, temperature, supply voltage, and the like. For example, the comparator circuit described herein may enable the speed and/or noise of the SAR ADC comparator to be set independent of variations in process corner, supply voltages, temperature, input common mode, and/or the reference voltage.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

For example, means for sampling may include one or more sensing capacitors, such as the sensing capacitors 544, 546, and 548 of FIG. 5. Means for comparing may include a comparator, such as the first comparator 502 or the second comparator 524 of FIG. 5. Means for adjusting may include a sensing circuit, such as the sensing circuit 506 of FIG. 5. Means for generating a target common-mode voltage may include a common-mode voltage generator, such as the common-mode voltage generator 526 of FIG. 5.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus may link various circuits such as a network adapter, timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An analog-to-digital converter (ADC) comprising:
   a first comparator having a first input and a second input;
   a second comparator having a first input, a second input, and an output;
   a digital-to-analog converter (DAC) coupled to at least one of the first input or the second input of the first comparator and selectively coupled to the first input of the second comparator;
   a common-mode voltage generator having an output coupled to the second input of the second comparator, wherein the common-mode voltage generator comprises a replica transistor matching an input-stage transistor of the first comparator; and
   a processing system having an input coupled to the output of the second comparator and having a set of outputs coupled to the DAC.

2. The ADC of claim 1, wherein the processing system is configured to adjust control signals applied to the DAC based on the output of the second comparator.

3. The ADC of claim 2, wherein the processing system is configured to adjust the control signals using a search process.

4. The ADC of claim 2, wherein the processing system is configured to adjust the control signals using a search process by increasing a digital value of the control signals.

5. The ADC of claim 1, further comprising:
   a first sensing capacitor having a terminal selectively coupled to the first input of the first comparator and selectively coupled to the first input of the second comparator; and
   a second sensing capacitor having a terminal selectively coupled to the second input of the first comparator and selectively coupled to the first input of the second comparator.

6. The ADC of claim 1, wherein the common-mode voltage generator comprises a leakage path circuit coupled in parallel with the replica transistor and configured to be enabled during a fast corner.

7. The ADC of claim 6, wherein the leakage path circuit comprises at least one of an n-channel transistor or a p-channel transistor having a same threshold voltage as the input-stage transistor of the first comparator.

8. A comparator circuit comprising:
a first comparator; and
a sensing circuit configured to digitally track a common-mode voltage of the first comparator, wherein the sensing circuit comprises:
  a second comparator having a first input, a second input, and an output, wherein an input of the sensing circuit is the first input of the second comparator;
  a common-mode voltage generator having an output coupled to the second input of the second comparator, wherein the common-mode voltage generator comprises a replica transistor matching an input-stage transistor of the first comparator; and
  a processing system configured to adjust digital control signals for controlling the common-mode voltage of the first comparator based on the output of the second comparator.

9. The comparator circuit of claim 8, further comprising:
a first sensing capacitor coupled to the first input of the second comparator; and
a second sensing capacitor coupled to the second input of the second comparator.

10. The comparator circuit of claim 8, wherein the sensing circuit is configured to adjust the digital control signals using a search process.

11. The comparator circuit of claim 10, wherein the sensing circuit is configured to adjust a value of the digital control signals during each iteration of the search process.

12. The comparator circuit of claim 8, wherein the replica transistor has a same threshold voltage as the input-stage transistor of the first comparator.

13. The comparator circuit of claim 8, wherein the sensing circuit comprises a leakage path circuit configured to be enabled during a fast process corner.

14. The comparator circuit of claim 13, wherein:
the leakage path circuit is coupled in parallel with the replica transistor matching the input-stage transistor of the first comparator; and
the leakage path circuit comprises a diode-connected transistor.

15. A method for tracking a common-mode voltage of a first comparator, comprising:
sampling the common-mode voltage of the first comparator, based on a common-mode input voltage and a reference voltage, across input terminals of the first comparator;
generating a target common-mode voltage with a common-mode voltage generator comprising a replica transistor that matches an input-stage transistor of the first comparator;
comparing, using a second comparator, the sampled common-mode voltage to the target common-mode voltage; and
adjusting control signals applied to a digital-to-analog converter (DAC) coupled to one of the input terminals of the first comparator according to the comparison between the sampled common-mode voltage and the target common-mode voltage.

16. The method of claim 15, wherein adjusting the control signals comprises adjusting the control signals using a search process.

17. The method of claim 16, wherein using the search process comprises adjusting a digital value of the control signals by one least-significant bit during each iteration of the search process.

18. The method of claim 15, wherein the replica transistor has a same threshold voltage as the input-stage transistor of the first comparator.

19. The method of claim 15, wherein the target common-mode voltage is generated with a leakage path during a fast corner, wherein the leakage path is coupled in parallel with the replica transistor matching the input-stage transistor of the first comparator and wherein the leakage path comprises a diode-connected transistor.

* * * * *